US011532918B2

(12) United States Patent
Yang et al.

(10) Patent No.: US 11,532,918 B2
(45) Date of Patent: Dec. 20, 2022

(54) DETECTION DEVICE AND METHOD FOR DETECTING INSERTION DEPTH OF TERMINAL OF CABLE CONNECTOR

(71) Applicant: Tyco Electronics (Shanghai) Co. Ltd., Shanghai (CN)

(72) Inventors: An Yang, Shanghai (CN); Lvhai Hu, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 388 days.

(21) Appl. No.: 16/774,715

(22) Filed: Jan. 28, 2020

(65) Prior Publication Data
US 2020/0251870 A1    Aug. 6, 2020

(30) Foreign Application Priority Data

Jan. 31, 2019 (CN) .......................... 201910101877.2

(51) Int. Cl.
| | |
|---|---|
| *H01R 43/20* | (2006.01) |
| *H01R 13/66* | (2006.01) |
| *H01R 13/516* | (2006.01) |
| *H01R 13/502* | (2006.01) |
| *H01R 13/11* | (2006.01) |
| *G01R 31/69* | (2020.01) |
| *H01R 13/62* | (2006.01) |

(52) U.S. Cl.
CPC .............. *H01R 43/20* (2013.01); *G01R 31/69* (2020.01); *H01R 13/11* (2013.01); *H01R 13/502* (2013.01); *H01R 13/516* (2013.01); *H01R 13/62* (2013.01); *H01R 13/6683* (2013.01)

(58) Field of Classification Search
CPC ...... H01R 43/20; H01R 13/11; H01R 13/502; H01R 13/516; H01R 13/62
USPC ............................................................ 29/747
See application file for complete search history.

(56) References Cited

U.S. PATENT DOCUMENTS

| | | | | | |
|---|---|---|---|---|---|
| 4,180,287 | A | * | 12/1979 | Youngblood | ....... E05B 65/0017 292/144 |
| 4,949,451 | A | * | 8/1990 | Pech | ....................... H01R 43/20 29/742 |
| 6,149,464 | A | * | 11/2000 | DeBauche | .......... H01R 13/6594 439/108 |
| 6,364,694 | B1 | * | 4/2002 | Lien | ........................ H01R 29/00 439/489 |
| 6,755,681 | B2 | * | 6/2004 | Chen | ....................... H01R 24/38 439/675 |
| 6,880,095 | B2 | * | 4/2005 | Cromer | .................... G06F 1/266 307/85 |

(Continued)

*Primary Examiner* — Alexander Gilman
(74) *Attorney, Agent, or Firm* — Barley Snyder

(57) ABSTRACT

A detection device for detecting an insertion depth of a terminal of a cable connector inside a housing of the cable connector includes a positioning assembly and a detection assembly. The positioning assembly positions the housing of the cable connector. The detection assembly includes a first driving device, a sensing element mounted on the first driving device and movable by the first driving device, and a displacement sensor mounted on the first driving device and movable in a moving direction of the sensing element by the first driving device. The displacement sensor is connected to the sensing element and senses a displacement of the sensing element.

22 Claims, 4 Drawing Sheets

(56) References Cited

U.S. PATENT DOCUMENTS

| | | | | |
|---|---|---|---|---|
| 7,513,795 B1* | 4/2009 | Shaw | ................... | H01R 9/0521 |
| | | | | 439/585 |
| 7,867,017 B1* | 1/2011 | Chen | .................. | H01R 13/7031 |
| | | | | 439/488 |
| 8,149,127 B2* | 4/2012 | Montena | ................ | H01R 24/44 |
| | | | | 439/578 |
| 8,414,326 B2* | 4/2013 | Bowman | ............... | H01R 24/42 |
| | | | | 439/913 |
| 8,618,944 B2* | 12/2013 | Montena | ................ | H01R 24/44 |
| | | | | 439/578 |
| 8,773,255 B2* | 7/2014 | Montena | .............. | H01R 13/641 |
| | | | | 439/578 |
| 8,894,435 B2* | 11/2014 | Behziz | ................... | H01R 43/24 |
| | | | | 439/489 |
| 2006/0068645 A1* | 3/2006 | Ollivier | ................. | H01R 24/58 |
| | | | | 439/669 |
| 2007/0141882 A1* | 6/2007 | Stepniak | ................ | H01R 13/53 |
| | | | | 439/187 |
| 2020/0080901 A1* | 3/2020 | Myer | ....................... | G01K 5/62 |
| 2020/0251870 A1* | 8/2020 | Yang | ...................... | H01R 13/11 |

\* cited by examiner

DETECTION DEVICE AND METHOD FOR DETECTING INSERTION DEPTH OF TERMINAL OF CABLE CONNECTOR

CROSS-REFERENCE TO RELATED APPLICATION

This application claims the benefit of the filing date under 35 U.S.C. § 119(a)-(d) of Chinese Patent Application No. 201910101877.2, filed on Jan. 31, 2019.

FIELD OF THE INVENTION

The present invention relates to a detection device and, more particularly, to a detection device for detecting an insertion depth of a terminal of a cable connector inside a housing of the cable connector.

BACKGROUND

A cable connector 200 according to the prior art, as shown in FIG. 1, includes a housing 202, a cable 203, a terminal 201 inside the housing 202, and a radial extending portion 204 on a peripheral wall of the housing 202. A first end (a right end as shown in FIG. 1) of the housing 202 is connected with the cable 203 and may be referred to as a cable connection end. The terminal 201 is adjacent to a second end of the housing 202 opposite to the cable connection end, and the terminal 201 has a free end.

The terminal 201 is a key element for connection and transmission in the cable connector 200. During assembly of the cable connector 200, the terminal 201 is typically crimped onto a conductor of the cable 203 and then inserted into the housing 202 to be protected. It is necessary to ensure an insertion depth of the terminal 201 into the housing 202 is correct because a too small or too large insertion depth may result in improper connection.

SUMMARY

A detection device for detecting an insertion depth of a terminal of a cable connector inside a housing of the cable connector includes a positioning assembly and a detection assembly. The positioning assembly positions the housing of the cable connector. The detection assembly includes a first driving device, a sensing element mounted on the first driving device and movable by the first driving device, and a displacement sensor mounted on the first driving device and movable in a moving direction of the sensing element by the first driving device. The displacement sensor is connected to the sensing element and senses a displacement of the sensing element.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
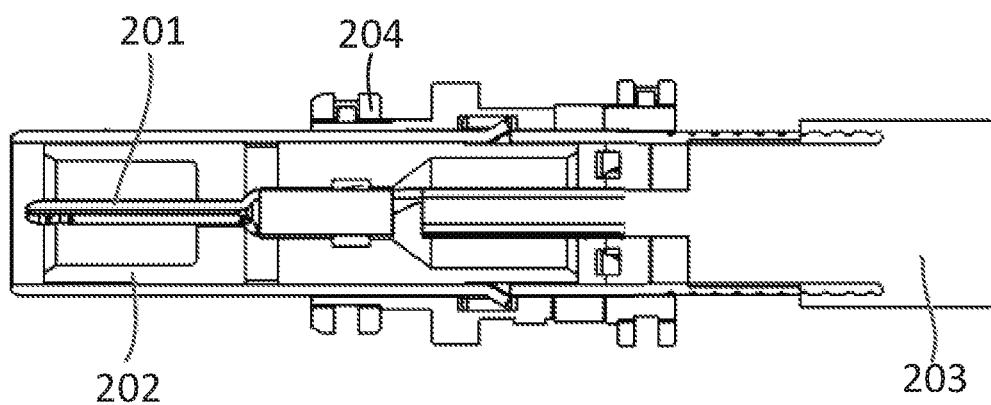
FIG. 1 is a sectional side view of a cable connector according to the prior art.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A detection device 100 according to an embodiment of the invention, as shown in FIGS. 2-5, includes a positioning assembly 10 adapted to position the housing 202 of the cable connector 200 shown in FIG. 1 and a detection assembly 20.

Figure 2:
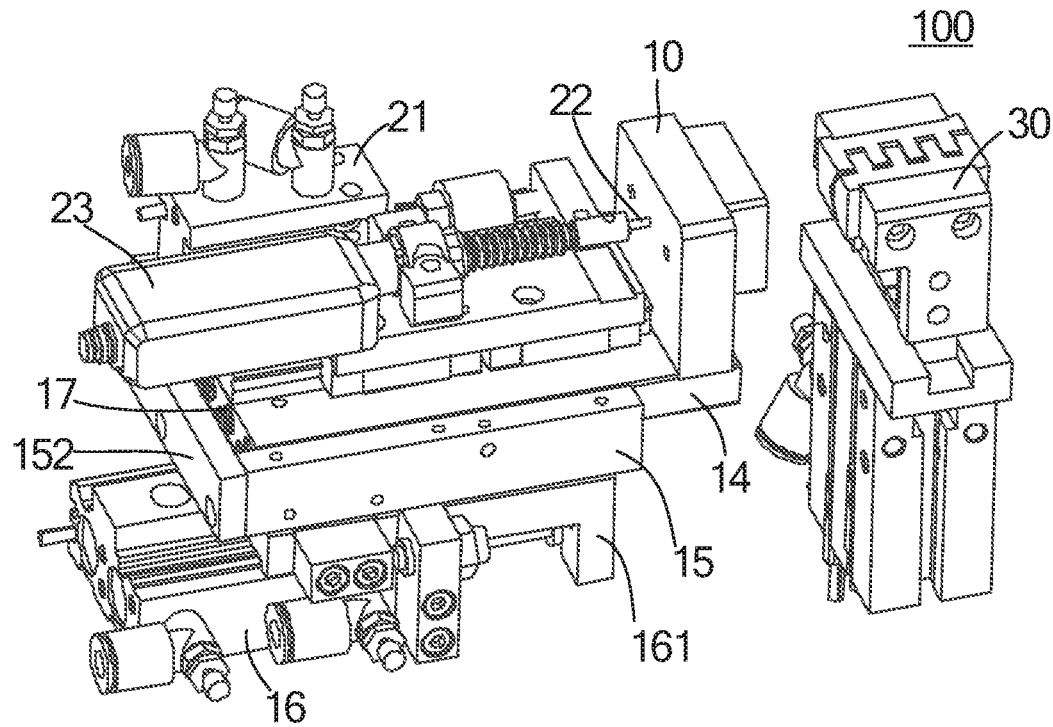
FIG. 2 is a perspective view of a detection device according to an embodiment.

The detection assembly 20 includes a first driving device 21 and a sensing element 22, as shown in FIG. 2. The sensing element 22 is mounted on the first driving device 21 to be movable towards the terminal 201 of the cable connector 200 under a driving of the first driving device 21, so as to be in contact with the free end of the terminal 201 located inside the housing 202.

The detection assembly 20, as shown in FIG. 2, further includes a displacement sensor 23 mounted on the first driving device 21 to be movable in a moving direction of the sensing element 22 under the driving of the first driving device 21. The displacement sensor 23 is connected to the sensing element 22 such that, when the sensing element 22 is in contact with the free end of the terminal 201, the displacement sensor 23 senses a displacement $S_{measure}$ of the sensing element 22, thereby obtaining an insertion depth S of the terminal 201 inside the housing 202 of the cable connector 200 based on the displacement $S_{measure}$ of the sensing element 22 sensed by the displacement sensor 23.

For example, the insertion depth S of the terminal 201 inside the housing 202 of the cable connector 200 may be calculated by the following equation:

$$S = S_{measure} - S_0,$$

wherein $S_0$ is a distance between an initial position of sensing element 22 and the end (left end as shown in FIG. 1) of the housing 202 of the cable connector 200 opposite to the cable connection end after the housing 202 is positioned.

As shown in FIGS. 2-6, the positioning assembly 10 includes a positioning plate. In the shown embodiment, the positioning plate includes a first plate 11 having a first through hole 111 extending in the moving direction of the sensing element 22 and a second plate 12 having a second through hole 121 extending in the moving direction of the sensing element 22. A central axis of the second through hole 121 is collinear with a central axis of the first through hole 111, and a diameter of the second through hole 121 is larger than a diameter of the first through hole 111.

Figure 6:
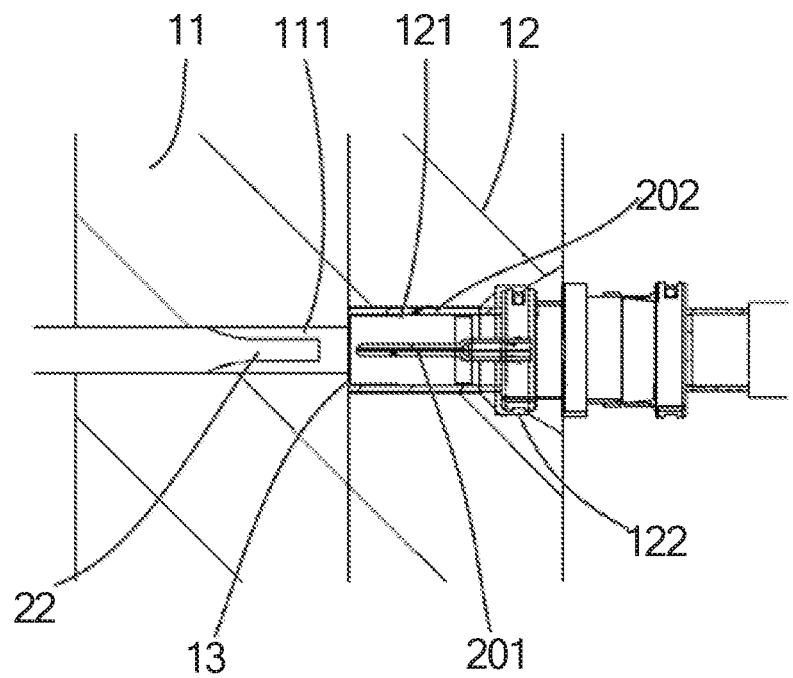
FIG. 6 is a schematic sectional view of a cable connector, a positioning plate, and a sensing element of the detection device.

In use, the cable connector 200 is inserted into the second through hole 121 of the second plate 12, and then the sensing element 22 is driven by the first driving device 21 to move from the initial position towards the cable connector 200, passes through the first through hole 111 of the first plate 11 as shown in FIG. 6, and then contacts the terminal 201 of the cable connector 200 located inside the second through hole 121. Because the central axis of the second through hole 121 is collinear with the central axis of the first through hole 111 and the diameter of the second through hole 121 is not equal to that of the first through hole 111, a step 13 is formed at a connection part between the first through hole 111 and the second through hole 121, so that the end of the housing 202 of the cable connector 200 opposite to the cable connection end abuts onto the step 13. The cable connector 200 is inserted into the second through hole 121, and the end of the housing 202 of the cable connector 200 opposite to the cable connection end abuts onto the step 13, so as to position the housing 202 of the cable connector 200. The step 13 is used as a measurement reference surface, and the distance $S_0$ between the initial position of sensing element 22 and the end of the housing 202 of the cable connector 200 opposite to the cable connection end after the housing 202 is positioned is equal to a distance between the initial position of the sensing element 22 and the step 13.

Figure 3:
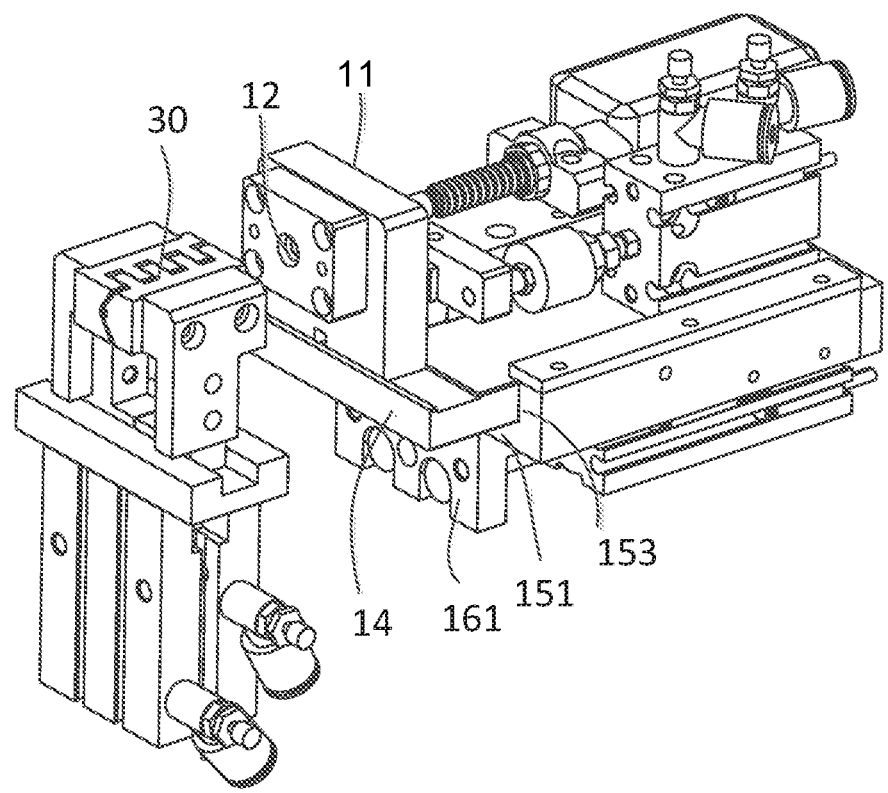
FIG. 3 is another perspective view of the detection device.

In an embodiment, as shown in FIG. 3, the second plate 12 is detachably connected with the first plate 11, such as by a screw connection, a snap connection, or the like. In this way, the second plate 12 may be replaced with other second plates 12 having different second through holes 121, so that the detection device 100 may be applied to cable connectors 200 which have different sizes and similar structures.

In other embodiments, the first plate 11 and the second plate 12 of the positioning assembly 10 may be made of a single piece of material, the positioning plate having a through hole extending in the moving direction of the sensing element 22 for inserting the cable connector 200. A step 13 is provided on a sidewall of the through hole so that the end of the housing 202 of the cable connector 200 opposite to the cable connection end abuts onto the step 13. The cable connector 200 is inserted into the through hole, and the end of the housing 202 of the cable connector 200 opposite to the cable connection end abuts onto the step 13, so as to position the housing 202 of the cable connector 200. In such an embodiment, the step 13 is thus similarly used as the measurement reference surface.

In other embodiments, other positioning assemblies adapted to position the housing 202 of the cable connector 200 may be used, such as a clamping device, by which the housing 202 is positioned relative to the sensing element 22. In use, the sensing element 22 is driven by the first driving device 21 to move from the initial position towards the cable connector 200, so as to contact with the free end of the terminal 201 of the cable connector 200, and when the sensing element 22 is in contact with the free end of the terminal 201, the displacement $S_{measure}$ between the initial position and a position of the sensing element 22 where it is in contact with the terminal 201 is sensed by the displacement sensor 23, so as to obtain the insertion depth S of the terminal 201 inside the housing 202 of the cable connector 200.

As shown in FIGS. 2-5, the positioning assembly 10 further includes a support plate 14. The positioning plate 10 is connected to a first end of the support plate 14 in the moving direction of the sensing element 22 and the first driving device 21 is provided on the support plate 14.

The positioning assembly 10, as shown in FIGS. 2 and 3, further includes a support base 15 slidably connected to the support plate 14 in the moving direction of the sensing element 22 and including a bottom plate 151 and a first side plate 152 connected to the bottom plate 151. The first side plate 152 faces a second end of the support plate 14 opposite to the first end.

The positioning assembly 10, as shown in FIGS. 2 and 3, further includes a second driving device 16 and an elastic element 17 (e.g. spring). The second driving device 16 is connected to the support base 15 and adapted to drive the support base 15 to slide in the moving direction of the sensing element 22. The elastic element 17 is provided between the second end of the support plate 14 and the first side plate 152. The second driving device 16 drives the support base 15 to move in the moving direction of the sensing element 22, so as to drive the support plate 14 slidably connected to the support base 15 together with the first driving device 21, the sensing element 22, the displacement sensor 23 and the positioning plate 10 on the support plate 14 to move in the moving direction of the sensing element 22. The end of the housing 202 of the cable connector 200 opposite to the cable connection end is thereby inserted into the through hole 121 until the elastic element 17 is compressed, thereby ensuring the end of the housing 202 of the cable connector 200 opposite to the cable connection end abuts onto the step 13.

The first driving device 21, in an embodiment, includes a first cylinder mounted on the support plate 14 and a first piston rod slidably mounted in the first cylinder and reciprocally movable in the moving direction of the sensing element 22.

Figure 4:
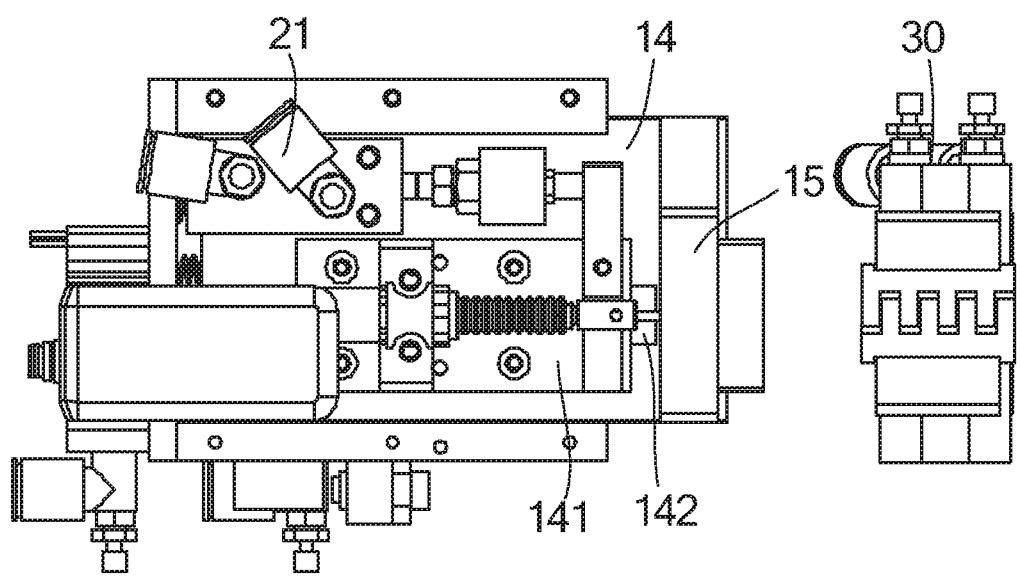
FIG. 4 is a top view of the detection device.
Figure 5:
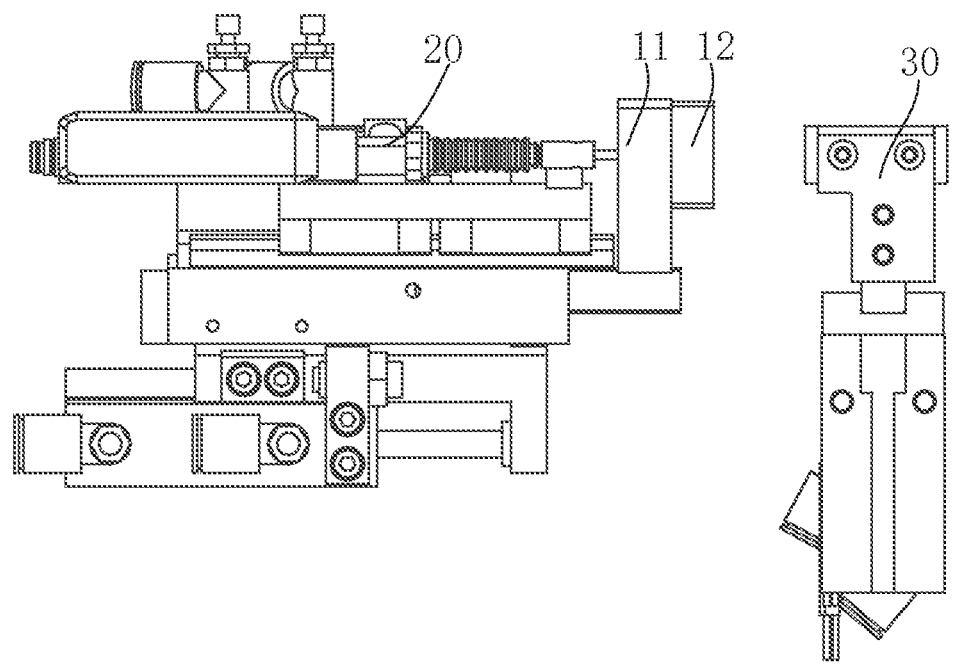
FIG. 5 is a front view of the detection device.

The support plate 14, as shown in FIG. 4, includes a second sliding rail 141 and a sliding member 142 engaging with the second sliding rail 141. The sliding member 142 is connected to the first piston rod and the sensing element 22 and the displacement sensor 23 are provided on the sliding member 142. When the sliding member 142 moves in the moving direction of the sensing element 22 under a driving of the first piston rod, the sensing element 22 and the displacement sensor 23 may be driven to move in the moving direction of the sensing element 22. Further, it is possible to ensure that the moving direction of the sensing element 22 and the displacement sensor 23 do not deviate by the engagement of the sliding member 142 and the second sliding rail 141.

The second driving device 16, as shown in FIGS. 2 and 3, includes a base 161, a second cylinder mounted on the base 161, and a second piston rod slidably mounted in the second cylinder and reciprocally movable in the moving direction of the sensing element 22. The support base 15 is mounted on the second piston rod to move reciprocally in the moving direction of the sensing element 22 under a driving of the second piston rod.

The support base 15, as shown in FIG. 3, includes at least one guiding portion 153 connected to the bottom plate 151 and parallel to the moving direction of the sensing element 22 to guide the support plate 14 to move in the moving direction of the sensing element 22.

As shown in FIG. 6, the second plate 12 has an engaging groove 122 extending radially outward from the second through hole. The engaging groove 122 may engage with the radial extending portion 204 of the housing 202 of the cable connector 200 so as to prevent the cable connector 200 from being at least partially detached from the second through hole 121 during the detection.

The detection device 100, as shown in FIGS. 2-5, further includes a clamping device 30. The clamping device 30 clamps the cable 203 of the cable connector 200 to prevent the cable 203 as well as the cable connector 200 from moving relative to the positioning plate during the detection.

Figure 7:
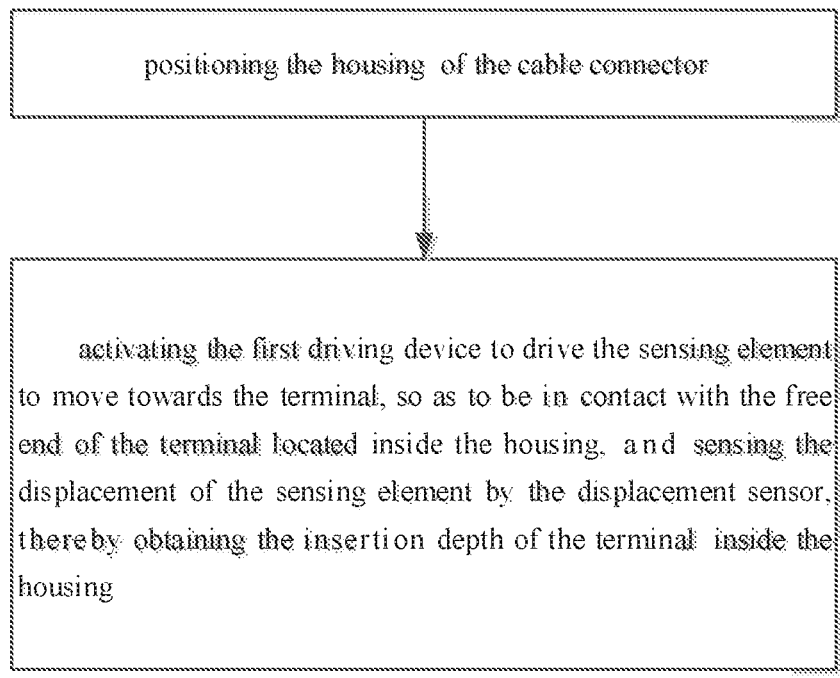
FIG. 7 is a flowchart of a method for detecting an insertion depth of a terminal of a cable connector using the detection device.

A method for detecting the insertion depth of the terminal 201 of the cable connector 200 using the detection device 100 is shown in FIG. 7. The method includes the steps of:

S1: positioning the housing 202 of the cable connector 200; and

S2: activating the first driving device 21 to drive the sensing element 22 to move towards the terminal 201 of the cable connector 200 until the sensing element 22 is in contact with the free end of the terminal 201 located inside the housing 202, and sensing the displacement of the sensing element 22 by the displacement sensor 23, thereby obtaining the insertion depth S of the terminal 201 inside the housing 202 based on the sensed displacement $S_{measure}$ of the sensing element 22.

In an embodiment, in step S1, the cable connector 200 is inserted into the through hole 111, 121 of the positioning assembly 10 and the end of the housing 202 of the cable connector 200 opposite to the cable connection end abuts onto the step 13 of the through hole 111, 121, so as to position the housing 201 of the cable connector 200. After positioning the housing 201 of the cable connector 200, the sensing element 22 is driven by the first driving device 21 to be gradually inserted into the first through hole 111 from a side of the positioning plate 10 opposite to an insertion side of the cable connector so as to be in contact with the free end of the terminal 201 located inside the second through hole 121.

In some exemplary embodiments, the second driving device 16 is activated to drive the support base 15 to move towards the terminal 201 of the cable connector 200 in the moving direction of the sensing element 22, so that the cable connector 200 is inserted into the first through hole 121 until the elastic element 17 is compressed. In this way, the cable connector 200 is inserted into the through hole 111, 121 of the positioning plate 10 and the end of the housing 202 of the cable connector 200 opposite to the cable connection end abuts onto the step 13.

In some exemplary embodiments, in step S2, obtaining the insertion depth S of the terminal 201 inside the housing 202 based on the sensed displacement of the sensing element 22 includes: obtaining the distance $S_0$ between the initial position of the sensing element 22 and the end of the housing 201 of the cable connector 200 opposite to the cable connection end; subtracting the distance $S_0$ from the sensed displacement $S_{measure}$ of the sensing element 22 sensed by the displacement sensor 23 to obtain the distance S between the free end of the terminal 201 and the end of the housing 202 opposite to the cable connection end, that is, the insertion depth S of the terminal 201 inside the housing 202.

In the detection device 100 and method for detecting the insertion depth of the terminal 201 of the cable connector 200 inside the housing 202 of the cable connector 200 according to the above embodiments of the present disclosure, the housing 202 of the cable connector 200 is positioned, then the first driving device 21 drives the sensing element 22 and the displacement sensor 23 to move towards the terminal 201 of the cable connector 200. When the sensing element 22 is in contact with the terminal 201, the displacement of the sensing element 22 is sensed by the displacement sensor 23, and the distance between the free end of the terminal 201 of the cable connector 200 and the end of the housing 202 of the cable connector 202 opposite to the cable connection end, that is, the insertion depth S of the terminal 201 inside the housing 202, is obtained based on the sensed displacement of the sensing element 22. The detection device 100 is easy to operate and does not need to use a laser or a vision system. Only one displacement sensor 23 is necessary, so it is more stable and cheaper.

The above-described embodiments are exemplary and modifications may be made by those skilled in the art. Structures described in the various embodiments may be freely combined without conflict in structure or principle. Although the embodiments of the present disclosure have been described in detail, it will be apparent to those skilled in the art that various changes and modifications can be made without departing from the scope and spirit of the appended claims, and the disclosure is not limited to the exemplary embodiments illustrated in the specification.

What is claimed is:

1. A detection device for detecting an insertion depth of a terminal of a cable connector inside a housing of the cable connector, comprising:
    a positioning assembly positioning the housing of the cable connector; and
    a detection assembly including a first driving device, a sensing element mounted on the first driving device and movable by the first driving device, and a displacement sensor mounted on the first driving device and movable in a moving direction of the sensing element by the first driving device, the displacement sensor is connected to the sensing element and senses a displacement of the sensing element.

2. The detection device of claim 1, wherein the positioning assembly positions the housing of the cable connector with respect to the detection assembly.

3. The detection device of claim 1, wherein the sensing element is movable by the first driving device into contact with an end of the terminal of the cable connector.

4. The detection device of claim 1, wherein the positioning assembly includes a positioning plate having a through hole extending in the moving direction and a step disposed on a sidewall of the through hole.

5. The detection device of claim 4, further comprising a clamping device clamping a cable of the cable connector to prevent the cable from moving relative to the positioning plate.

6. The detection device of claim 4, wherein the positioning plate includes a first plate having a first through hole extending in the moving direction and a second plate having a second through hole extending in the moving direction.

7. The detection device of claim 6, wherein a central axis of the second through hole is collinear with a central axis of the first through hole, and a diameter of the second through hole is larger than a diameter of the first through hole.

8. The detection device of claim 7, wherein the second plate has an engaging groove extending radially outward from the second through hole and engaging a radially extending portion of the housing.

9. The detection device of claim 7, wherein the second plate is detachably connected to the first plate.

10. The detection device of claim 4, wherein the positioning assembly includes a support plate having a first end in the moving direction, the positioning plate connected to the first end of the support plate and the first driving device disposed on the support plate.

11. The detection device of claim 10, wherein the positioning assembly includes a support base slidably connected to the support plate in the moving direction, the support base having a bottom plate and a first side plate connected to the bottom plate, the first side plate facing a second end of the support plate opposite to the first end.

12. The detection device of claim 11, wherein the positioning assembly includes a second driving device connected to the support base and driving the support base to slide in the moving direction.

13. The detection device of claim 12, wherein the positioning assembly includes an elastic element disposed between the second end of the support plate and the first side plate.

14. The detection device of claim 13, wherein the first driving device includes a first cylinder mounted on the support plate and a first piston rod slidably mounted in the first cylinder and reciprocally movable in the moving direction.

15. The detection device of claim 14, wherein the support plate has a second sliding rail and a sliding member engaging with the second sliding rail, the sliding member is connected to the first piston rod, the sensing element and the displacement sensor are disposed on the sliding member.

16. The detection device of claim 13, wherein the second driving device includes a base, a second cylinder mounted on the base, and a second piston rod slidably mounted in the second cylinder and reciprocally movable in the moving direction, the support base mounted on the second piston rod.

17. The detection device of claim 16, wherein the support base includes a guiding portion connected to the bottom plate and parallel to the moving direction, the guiding portion guiding the support plate to move in the moving direction.

18. A method for detecting an insertion depth of a terminal of a cable connector inside a housing of the cable connector, comprising:
   providing a detection device including a positioning assembly and a detection assembly, the positioning assembly includes a positioning plate having a through hole extending in the moving direction and a step disposed on a sidewall of the through hole, the detection assembly includes a first driving device, a sensing element mounted on the first driving device and movable by the first driving device, and a displacement sensor mounted on the first driving device and movable in a moving direction of the sensing element by the first driving device, the displacement sensor is connected to the sensing element;
   positioning the housing of the cable connector with the positioning assembly;
   activating the first driving device to drive the sensing element to move towards the terminal until the sensing element is in contact with a free end of the terminal inside the housing;
   sensing a displacement of the sensing element with the displacement sensor; and
   obtaining the insertion depth of the terminal inside the housing based on the displacement of the sensing element.

19. The method of claim 18, wherein the obtaining step includes obtaining a distance between an initial position of the sensing element and an end of the housing opposite to a cable connection end of the housing, and subtracting the distance from the displacement of the sensing element to obtain the insertion depth of the terminal inside the housing.

20. The method of claim 18, wherein the positioning step includes inserting the cable connector into the through hole of the positioning plate until an end of the housing opposite to a cable connection end of the housing abuts on the step of the through hole.

21. The method of claim 20, wherein the positioning assembly includes:
   a support plate having a first end in the moving direction, the positioning plate connected to the first end of the support plate and the first driving device disposed on the support plate;
   a support base slidably connected to the support plate in the moving direction, the support base having a bottom plate and a first side plate connected to the bottom plate, the first side plate facing a second end of the support plate opposite to the first end;
   a second driving device connected to the support base and driving the support base to slide in the moving direction; and
   an elastic element disposed between the second end of the support plate and the first side plate.

22. The method of claim 21, wherein the inserting step includes activating the second driving device to drive the support base to move towards the terminal of the cable connector in the moving direction, so that the cable connector is inserted into the through hole until the elastic element is compressed.

* * * * *